US011575005B2

(12) United States Patent
Sung et al.

(10) Patent No.: US 11,575,005 B2
(45) Date of Patent: Feb. 7, 2023

(54) ASYMMETRICAL SEMICONDUCTOR NANOWIRE FIELD-EFFECT TRANSISTOR

(71) Applicant: INTEL CORPORATION, Santa Clara, CA (US)

(72) Inventors: Seung Hoon Sung, Portland, OR (US); Dipanjan Basu, Hillsboro, OR (US); Ashish Agrawal, Hillsboro, OR (US); Benjamin Chu-Kung, Portland, OR (US); Siddharth Chouksey, Portland, OR (US); Cory C. Bomberger, Portland, OR (US); Tahir Ghani, Portland, OR (US); Anand S. Murthy, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 973 days.

(21) Appl. No.: 15/942,252

(22) Filed: Mar. 30, 2018

(65) Prior Publication Data
US 2019/0305085 A1 Oct. 3, 2019

(51) Int. Cl.
H01L 29/06 (2006.01)
H01L 29/423 (2006.01)
H01L 29/10 (2006.01)
H01L 29/66 (2006.01)
H01L 29/78 (2006.01)
H01L 29/16 (2006.01)

(52) U.S. Cl.
CPC ...... H01L 29/0676 (2013.01); H01L 29/1037 (2013.01); H01L 29/16 (2013.01); H01L 29/42392 (2013.01); H01L 29/66666 (2013.01); H01L 29/66787 (2013.01); H01L 29/7827 (2013.01)

(58) Field of Classification Search
CPC ..... H01L 29/0665–0676; H01L 29/775; H01L 29/66439; H01L 29/66467; H01L 29/66659; H01L 29/7835; H01L 29/0878; H01L 29/086; H01L 29/0847; H01L 29/78635
See application file for complete search history.

(56) References Cited

U.S. PATENT DOCUMENTS

2013/0207079 A1* 8/2013 Sleight ............. H01L 29/42392
977/762
2016/0254348 A1* 9/2016 Bhuwalka ......... H01L 29/42392
257/288
2018/0151448 A1* 5/2018 Wang ................. H01L 27/1203

* cited by examiner

Primary Examiner — John A Bodnar
(74) Attorney, Agent, or Firm — Schwabe, Williamson & Wyatt, P.C.

(57) ABSTRACT

An integrated circuit structure includes: a semiconductor nanowire extending in a length direction and including a body portion; a gate dielectric surrounding the body portion; a gate electrode insulated from the body portion by the gate dielectric; a semiconductor source portion adjacent to a first side of the body portion; and a semiconductor drain portion adjacent to a second side of the body portion opposite the first side, the narrowest dimension of the second side of the body portion being smaller than the narrowest dimension of the first side. In an embodiment, the nanowire has a conical tapering. In an embodiment, the gate electrode extends along the body portion in the length direction to the source portion, but not to the drain portion. In an embodiment, the drain portion at the second side of the body portion has a lower dopant concentration than the source portion at the first side.

17 Claims, 9 Drawing Sheets

ASYMMETRICAL SEMICONDUCTOR NANOWIRE FIELD-EFFECT TRANSISTOR

BACKGROUND

Low bandgap materials can improve field-effect transistor (FET) performance. However, such materials can also suffer from large amounts of band-to-band tunneling (BTBT), which can lead to high off-state leakage.

Figure 1:
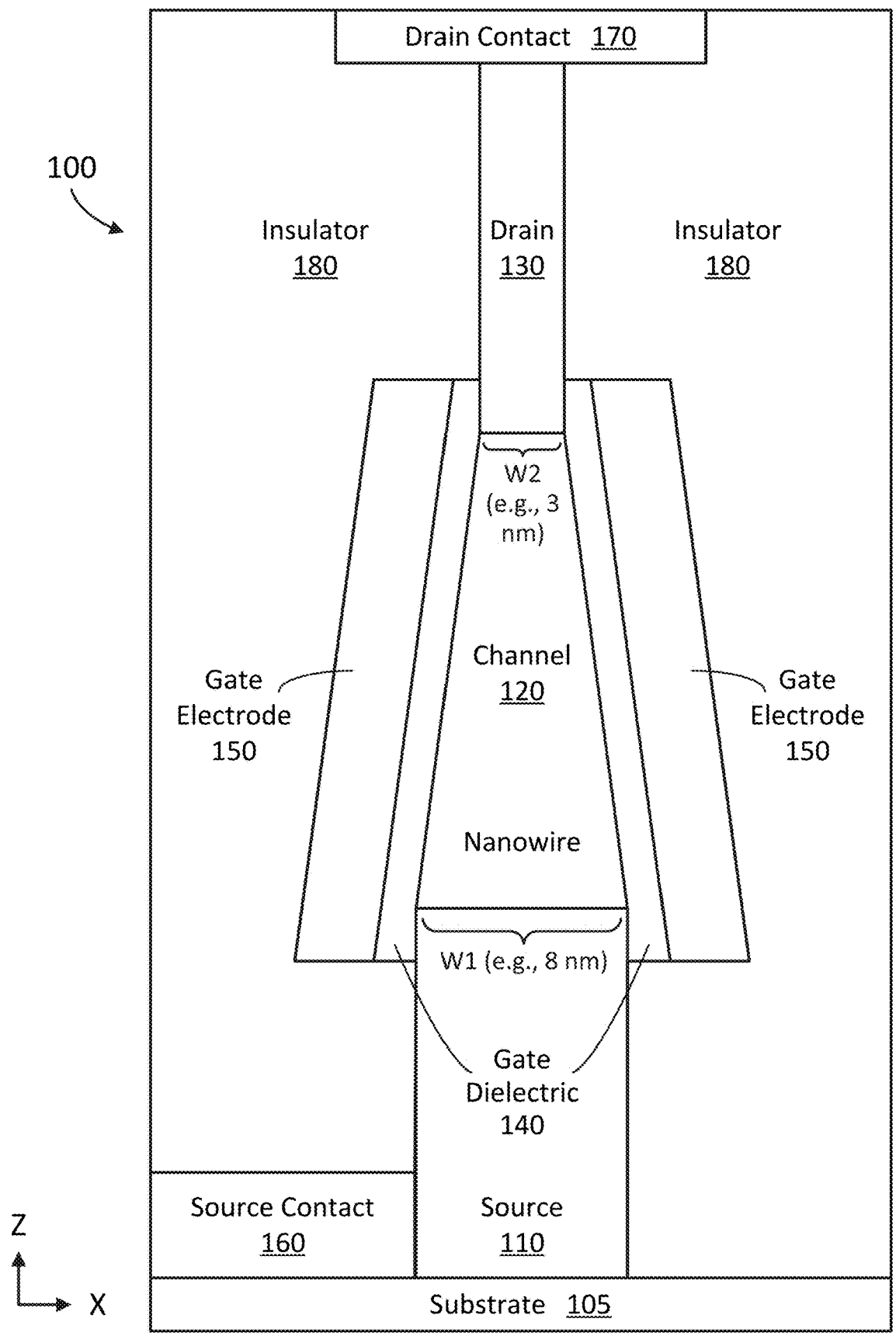
FIG. 1 is a cross-sectional view of an example vertical asymmetrical semiconductor nanowire field-effect transistor (FET), according to an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, acute or oblique angles, and smooth surfaces, an actual implementation of the disclosed techniques may have less than perfect straight lines, right angles, and acute or oblique angles, and some features may have surface topography or otherwise be non-smooth, given real-world limitations of fabrication processes. In short, the figures are provided merely to show example structures.

DETAILED DESCRIPTION

A semiconductor nanowire field-effect transistor (FET) having an asymmetric channel region is disclosed. The FET can have an asymmetric nanowire channel region arranged, for example, in a vertical architecture. In some embodiments, the FET can have a low bandgap semiconductor material in the channel region, and a larger bandgap at the drain side of the channel region than at the source side, all without significant impact to the saturation current. The FET can have a thinner channel region at the drain side than at the source side, which can raise the bandgap at the drain side but not at the source side. The gate electrode can extend along the channel region in the length direction to the source region of the FET, but not to the drain region. The drain region near the channel region can have a lower dopant concentration than the source region near the channel region. Numerous other semiconductor nanowire transistor configurations will be apparent in light of this disclosure.

General Overview

As noted above, low bandgap materials for FET channel regions can cause large amounts of band-to-band tunneling (BTBT), which can lead to high off-state leakage. For instance, lower bandgap material, such as semiconductor material having a bandgap less than that of silicon, has a relatively small energy difference between the electrons in the valence band and the conduction band of the material. Consequently, electrons more easily tunnel from the valence band to the conduction band in the channel regions of FETs made from such materials, which can lead to current flowing across the channel region even when the FETs are turned off. As a result, FET devices produced from such materials may be impractical for their intended use.

Accordingly, techniques are provided herein for a semiconductor nanowire transistor device architecture that employs an asymmetrical channel region. This allows, for example, low bandgap FETs having high on-state current and low off-state current. For instance, in some embodiments, low bandgap FETs include FETs whose channel regions contain semiconductor material with bandgaps less than that of silicon. In various embodiments of the present disclosure, smaller channel region thickness at the drain side of a FET channel region (than at the source side) increases the bandgap at the drain side (relative to the source side) and reduces BTBT without significantly affecting on-state current. This asymmetric channel region can be used, for example, in a vertical nanowire architecture. Factors such as channel region thickness (at a nanometer scale) can control the bandgap of a semiconductor material. According to various embodiments, channel region thickness differences are used to reduce or mitigate off-state current (for example, from sources such as BTBT from low bandgap material) while not significantly affecting on-state current. As such, various embodiments disclosed herein help address a fundamental issue of off-state leakage for low bandgap materials in high performing transistor devices such as FETs.

In some embodiments, channel region thickness at the drain side is used to control effects such as high off-state leakage in FETs by using an asymmetric structure (e.g., significantly narrower channel regions near the drain than near the source) to suppress the tunneling current that is a function of factors such as bandgap. In some embodiments, this asymmetric FET (for instance, an asymmetric metal oxide semiconductor FET, or MOSFET for short) is implemented vertically as a nanowire MOSFET having a trapezoidal (or other tapered shape) channel region. For example, in an embodiment, a vertical nanowire MOSFET having a germanium-based channel region with a thickness at the source side of 8 nanometers (nm) and a thickness at the drain side of 3 nm exhibits a bandgap of 0.95 electron volts (eV) at the source side (e.g., significantly less than that of silicon, to promote effects such as high on-state current) but 1.09 eV at the drain side (e.g., close to that of silicon, to suppress effects such as high off-state current).

In some embodiments, the low bandgap semiconductor nanowire FET performance is further improved by additional design asymmetries with respect to the drain side of the channel region. These asymmetries can further increase the bandgap near the drain side of the channel region (for instance, to further suppress off-state leakage current) while not significantly affecting on-state (such as saturation) current. For example, in some embodiments, the gate electrode extends lengthwise along the channel region up to (and perhaps past) the source side of the channel region, but falls short of the drain side of the channel region. For another example, in some embodiments, the doping of the drain region near the channel region is less than the doping of the source region near the channel region.

It should be noted that, throughout, terms such as "top" and "upper" as well as "bottom" and "lower" are used primarily for consistency and ease of description with the supplied drawings. However, the actual orientation during some of the fabrication processes or in some of the final products may differ between embodiments without departing from the scope of the present disclosure.

Materials that are "different" or "compositionally different" as used herein generally refers to two materials that have different chemical compositions. This compositional difference may be, for instance, by virtue of an element that is in one material but not the other (e.g., silicon germanium or SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., boron, gallium, and magnesium) or the same dopants but at differing concentrations.

In an example embodiment of the present disclosure, an integrated circuit (IC) structure is provided. The IC structure includes a semiconductor nanowire extending in a length direction (such as vertically with respect to an underlying substrate) and including a channel region or portion (sometimes also referred herein to as a semiconductor body, body portion, or simply body for purposes of brevity). The IC structure further includes a gate dielectric surrounding the body portion, a gate electrode on the gate dielectric, a semiconductor source portion adjacent to a first side (e.g., a bottom side) of the body portion, and a semiconductor drain portion adjacent to a second side (e.g., a top side) of the body portion. The second side is opposite the first side, such as opposite ends of the nanowire. The narrowest dimension of the second side (drain side) of the body portion is at least one nanometer (nm) smaller than the narrowest dimension of the first side (source side) of the body portion. For example, in some embodiments, the narrowest dimension of the second side of the body portion is at most half the narrowest dimension of the first side. In some such specific example embodiments, for instance, the narrowest dimension of the second side of the body portion is at most four nm, and the narrowest dimension of the first side is at least six nm.

In some embodiments, the gate electrode extends along the body portion in the length direction to the source portion, but not to the drain portion. In some embodiments, the drain portion at the second side of the body portion has a lower dopant concentration than the source portion at the first side of the body portion. In some embodiments, the nanowire has a tapered cross-section (e.g., a conical tapering, a convex tapering, or a concave tapering, to name a few) in the length direction. In some embodiments, the bandgap of the semiconductor material in the semiconductor nanowire is less than the bandgap of silicon. For instance, in some such embodiments, the nanowire includes germanium. Any combination of features from such example embodiments can be made. Numerous other example embodiments and configurations will be apparent in light of this disclosure.

System Architecture

FIG. 1 is a cross-sectional (X-Z) view of an example vertical asymmetrical semiconductor nanowire field-effect transistor (FET) 100 (or FET structure), according to an embodiment of the present disclosure. Here, X, Y, and Z represent orthogonal dimensions (such as length, width, and height, with the X and Y dimensions being horizontal dimensions and the Z dimension being the vertical dimension). As can be seem, the cross-section is taken through and parallel to the channel region.

Referring to FIG. 1, the FET 100 includes a substrate 105. The substrate 105 can be, for example, a semiconductor material, such as a semiconductor material used to form components of the FET 100. In other embodiments, the substrate 105 can be an insulating material, with the other components of the FET 100 formed thereon. The FET 100 further includes a semiconductor source region 110 (such as a heavily doped semiconductor region) and a semiconductor drain region 130 (which can also be heavily doped), electrically connected by a nanowire channel region 120 (or body region). The source region 110 and the drain region 130 can be the same semiconductor material as the channel region 120 or different. By heavily doped, dopant concentrations (such as impurities) can be, for example, $1 \times 10^{19}$ or greater per cubic centimeter (cc), while lightly doped can be to dopant concentrations of $1 \times 10^{18}$ or less per cc, according to some example embodiments. Note, however, that any number of doping schemes can be used, as will be appreciated.

The FET 100 further includes a gate structure surrounding the channel region 120 (e.g., a gate-all-around FET) and extending along the length direction of the nanowire and channel region 120, and between the source region 110 and the drain region 130. The gate structure is adjacent to the channel region 120 and can be implemented with any suitable processes and materials. For instance, the gate structure in the FET 100 of FIG. 1 includes gate dielectric 140 and a gate electrode 150. Further, the gate electrode 150 (and the gate dielectric 140) extend in the lengthwise direction of the nanowire (and channel region 120) past the channel region 120 and the drain region 130. In some other embodiments, the gate electrode 150 can extend in the lengthwise direction up to, but not past, one or both of the source region 110 and the drain region 130.

Any number of gate structure configurations can be used. The gate dielectric 140 may be, for example, any suitable gate dielectric material such as silicon dioxide or high-κ gate dielectric materials. Examples of high-κ gate dielectric materials include, for instance, hafnium oxide (e.g., hafnium dioxide), hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 140 to improve its quality when a high-κ material is used.

Further, the gate electrode 150 may include one or more of a wide range of suitable metals, metal alloys, conductive metal oxides, and heavily doped (e.g., degenerate) semiconductors, such as aluminum, tungsten, titanium, tantalum, copper, titanium nitride, or tantalum nitride, for example. In some embodiments, one or both of the gate dielectric 140 and the gate electrode 150 may include a multilayer structure of two or more material layers or components. For instance, in one such embodiment, the gate dielectric 140 is a bi-layer structure having a first dielectric material (e.g., silicon dioxide) in contact with the channel region 120 and a second dielectric material (e.g., hafnium oxide) in contact with the first dielectric material, the first dielectric material having a dielectric constant that is lower than the dielectric constant of the second dielectric material. Likewise, the gate electrode 150 structure may include a central metal plug portion (e.g., tungsten) with one or more outer work function layers and/or barrier layers (e.g., tantalum, tantalum nitride), and/or a resistance reducing cap layer (e.g., copper, gold). In some embodiments, one or both of the gate dielectric and gate electrode may include grading (increasing or decreasing, as the case may be) of the concentration of one or more materials therein. Numerous different gate structure configurations can be used, as will be apparent in light of this disclosure.

Insulating gate spacers (e.g., insulating oxide or nitride material, such as silicon nitride or silicon dioxide) on either side of the gate structure may separate the gate structure from other conductive structures, such as a source contact 160 and a drain contact 170. The source contact 160 and the drain contact 170 are, for example, a metal or metal alloy that make an ohmic contact with the semiconductor material of the source region 110 and the drain region 130, respectively. Insulator material 180 (e.g., silicon dioxide) fills otherwise empty portions of the FET structure 100 to help prevent any unintended short circuits in the IC.

The nanowire channel region 120 has a tapered shape, in this case, a conical or trapezoidal cross-sectional shape. As such, the channel region 120 is wider (or thicker) at the source region 110 boundary or side than at the drain region 130 boundary or side. For example, the narrowest dimension of the channel region 120 at the source side is W1 (e.g., 8 nm or other width) while the narrowest dimension of the channel region 120 at the drain side is W2 (e.g., 3 nm or other width smaller than the W1 width). Depending on factors such as the semiconductor material of the channel region 120, this can significantly increase the bandgap of the channel region material at the drain boundary, while not significantly affecting the bandgap of the channel region material at the source boundary. In some example embodiments, the nanowire channel region 120 includes germanium, but in some such embodiments, may further include other semiconductor materials, such as silicon (Si). In still other embodiments, any suitable low bandgap semiconductor material can be used for channel region 120, where the low bandgap semiconductor material can be, for example, semiconductor material having a bandgap less than that of silicon (Si).

The vertical asymmetrical semiconductor nanowire FET 100 can be fabricated using integrated circuit (IC) techniques such as photolithography, as would be apparent in light of the present disclosure. For example, the vertical nanowire and/or channel region 120 can be formed using a tapered etch (e.g., a tapered conical etch or a tapered trapezoidal etch) to conform the ends to the desired widths (e.g., W1 and W2), while the gate dielectric 140 and the gate electrode 150 can be formed (such as deposited) on the tapered channel region 120. It should be noted that in other embodiments, different orientations of the asymmetric nanowire are possible, as would be apparent in light of the present disclosure.

In some embodiments, the vertical nanowire in the FET 100 may be fabricated as part of a semiconductor fin (such as in a FinFET). The nanowire and other semiconductor components (e.g., source region 110 and drain region 130) can be the same or different semiconductor materials, such as one or more of silicon (Si), silicon germanium (SiGe), or a Group III-V semiconductor such as gallium arsenide (GaAs) or indium gallium arsenide (InGaAs) that is formed, for example, into vertical fins. At some point in the fabrication, some or all of the original fin structure may be replaced with a different fin structure using the original fin shape as a guide or template for forming the replacement fin or fins.

The source region 110 and the drain region 130 can be the same or different semiconductor material from that of the nanowire. The material or materials of the source region 110 and the drain region 130 can be the same as the that of the channel region 120 or varied depending on the material of the channel region 120. For example, when the channel region 120 is (or mostly includes) germanium, the source region 110 and the drain region can be highly doped SiGe or germanium. For another example, when the channel region 120 is InGaAs, the source region 110 and the drain region can be doped indium arsenide (InAs). Numerous other combinations will be appreciated.

By way of example, the semiconductor fins can be formed through photolithography, epitaxial growth (such as aspect ratio trapping, or ART), tapered etches, or similar techniques, with corresponding trenches between (and defined by) adjacent fins. The fins, for example, can be made of the same semiconductor material as a base semiconductor substrate for fabricating an IC structure, and be of a uniform or consistent width or shape (e.g., trapezoidal). The fin material can be replaced or grown as different materials, such as one or more nanowires arranged vertically in the original fin structure. Different materials can be used for the nanowire versus the source region 110 and the drain region 130. In some embodiments, a common semiconductor fin is used for the source region 110, channel region 120, and drain region 130. In some embodiments, a common semiconductor fin is used to form the source region 110, channel region 120, and drain region 130, the semiconductor fin possibly serving as a template for replacement fin material (e.g., epitaxially grown replacement fin material) to form one or more of the source region 110, channel region 120, and drain region 130.

For example, silicon (Si) can be used for some of the source region 110, channel region 120, and drain region 130, and silicon germanium (SiGe) for the other. In some other embodiments, Si and gallium arsenide (GaAs) can make up the source region 110, channel region 120, and drain region 130 (in some order or arrangement). In one or more embodiments, Si and a Group III-V semiconductor (e.g., a compound including a Group III element such as boron, aluminum, gallium, and indium together with a Group V element such as nitrogen, phosphorus, arsenic, antimony, and bismuth) make up the source region 110, channel region 120, and drain region 130 (in some order or arrangement). In some embodiments, Si and Ge make up the source region 110, channel region 120, and drain region 130 (in some order or arrangement or compound).

The source region 110 and the drain region 130 can be heavily doped (to increase conductivity). In some embodiments, the source region 110 is more heavily doped (such as two, five, or ten times as much) than the drain region 130. In some such embodiments, the source region 110 at the boundary of the channel region 120 is more heavily doped (such as two, five, or ten times as much) than the drain region 130 at the boundary of the channel region 120. This can help reduce BTBT, especially with low bandgap semiconductor materials for the channel region 120 (such as a bandgap less than 1.1 eV).

In some embodiments, the narrowest dimension of the channel region 120 at the drain side is at least one nm smaller than the narrowest dimension of the channel region 120 at the source side. In some embodiments, the narrowest dimension of the drain side of the channel region 120 is at most half (such as one third, two fifths, or one half) the narrowest dimension of the source side. In some embodiments, the narrowest dimension of the drain side of the channel region 120 is at most four nm (such as two nm, three nm, or four nm), and the narrowest dimension of the source side is at least six nm (such as six nm, 8 nm, or 10 nm). In still other embodiments, the narrowest dimension of the drain side of the channel region 120 is in the range of two to eight nm smaller (such as two nm, four nm, six nm, or eight nm smaller) than the narrowest dimension of the source side. In any such embodiments, note that the gate structure may not surround the channel region 120. For instance, the gate structure may be on multiple but not all sides of the channel region 120, or surround half or more but not all of the channel region 120, or the like.

As can be further seen in FIG. 1, and as can be appreciated, insulator material 180 can be effectively used to planarize the FET structure 100 to a desired height, such as the height of the gate structure, or the drain region 130, or a drain contact 170. The insulator material 180 can be, for instance, silicon dioxide, although any other suitable insulator fill material (e.g., polymer, oxide, nitride, etc.) can be used.

Source contact (or source contact structure) 160 and drain contact (or drain contact structure) 170 can be formed on or adjacent to (e.g., directly on, or in recesses etched into the insulator material 180 and/or gate spacers adjacent to) the underlying source region 110 and drain region 130, respectively. Each of the source contact 160 and the drain contact 170 generally includes one or more conductive materials that form an ohmic contact with the source region 110 and the drain region 130, respectively. Note that the etch can be selective to the gate spacer material (i.e., insulator 180 material etches at a rate much higher than the gate spacer material), although any suitable lithography process can be used to provide the contact trenches over or adjacent to the source regions 110 and drain regions 130.

Any number of contact structures can be used, as will be appreciated. In some example embodiments, such as those including a silicon or SiGe source region 110 and drain region 130, the source contact structure 160 and the drain contact structure 170 may include, for instance, a nickel silicide layer, a titanium nitride adhesion layer, and a tungsten plug or pad. In some cases, a contact resistance lowering material may be placed between the semiconductor source/drain material and plug metal. Example contact resistance reducing metals include nickel, platinum, nickel platinum, cobalt, titanium, or a multilayer structure of titanium and titanium nitride. Example metal plug material includes, for instance, tungsten, aluminum, ruthenium, cobalt, or copper, or a combination of such metals.

As can be further seen in FIG. 1, the FET 100 can be formed on and/or at least partially from a substrate 105. The substrate 105 can be, for example, a bulk substrate or a semiconductor-on-insulator (SOI) substrate, or a multi-layer substrate, or any other structure upon which the FET 100 can be formed (such as an etch stop layer or a planarized layer). In some embodiments, the substrate 105 is the same material as the channel region 120, and may further be the same material as the source region 110 and drain region 130. In such cases, the channel region 120 material (and possibly the source region 110 and drain region 130 materials) may be said to be native to the substrate 105. In other embodiments, channel region 120 material is compositionally different from the substrate 105 material. Numerous configurations can be implemented, as will be appreciated.

FIGS. 2-6 are cross-sectional (X-Z) views of example vertical asymmetrical semiconductor nanowire field-effect transistors (FETs) 200-600 (or FET structures), respectively, according to various other embodiments of the present disclosure. The FETs 200-600 of FIGS. 2-6 share numerous features in common with the FET 100 of FIG. 1. Accordingly, the description of FIGS. 2-6 will focus primarily on the differences between the FETs 200-600 of FIGS. 2-6 and the FET 100 of FIG. 1, and descriptions of the same or similar components may not be repeated.

Figure 2:
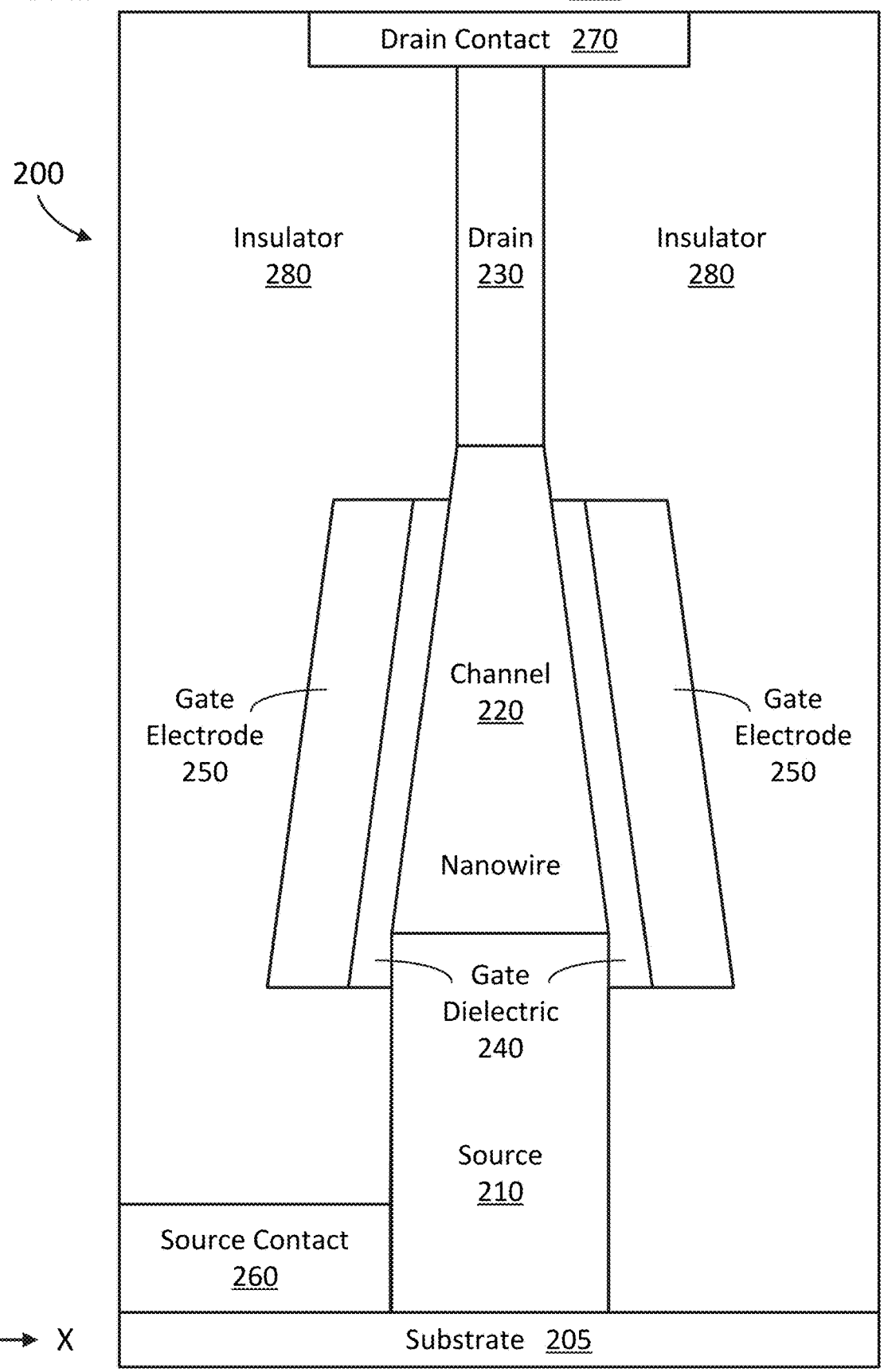
FIGS. 2-6 are cross-sectional views of example vertical asymmetrical semiconductor nanowire FETs, according to various other embodiments of the present disclosure.

In the vertical FET 200 of FIG. 2, substrate 205, source region 210, nanowire (including channel region 220), drain region 230, and drain contact 270 are arranged vertically, and can be similar to (e.g., same materials as, same dimensions as, same function as) the substrate 105, the source region 110, the nanowire (and channel region 120), the drain region 130, and the drain contact 170, respectively, of the FET 100 of FIG. 1. Further, in the FET 200, the materials of the gate dielectric 240 and gate electrode 250. can be similar to those same-named components of the FET 100 described above. Further, a source contact 260 and insulator 280 fulfill a similar role to the same-named structures in the FET 100 of FIG. 1, and can be made of the same or similar materials in the FET 200 of FIG. 2.

In the FET 200, however, the gate structure (in particular, the gate electrode 250, and possibly the gate dielectric 240) do not extend in the lengthwise direction of the channel region 220 to the drain region 230. Rather, the gate electrode 250 extends along the channel region 220 (or body portion) in the length direction to (and past) the source region 210, but not to the drain region 230. This change from the gate structure in the FET 200 can help further reduce BTBT for low bandgap channel region materials. In some other embodiments, the gate structure extends in the length direction up to but not past the source region 210.

For ease of description throughout, the nanowire will generally be restricted to the channel region 220, but in practice, the nanowire can encompass one or more of the source region 210 and the drain region 230 as well. For example, techniques such as different dopants and doping concentrations can be used to make portions of the nanowire function as the source region 210 or the drain region 230.

FIG. 2 shows a trapezoidal cross-section of the nanowire and the FET 200 with a tapered nanowire. The nanowire can have, for example, a prismatic shape, a conical shape, or the like. The channel region 220 has a smallest dimension at the drain side (e.g., near drain region 230) that is smaller than the smallest dimension of the channel region 220 at the source side (e.g., near source region 210). For example, the smallest dimension of the drain and source sides of the channel region 220 can be similarly limited to example differences provided in the description of the FET 100 of FIG. 1 above.

The vertical nanowire in the FET 200 may be fabricated, for example, as part of a semiconductor fin (such as in a FinFET). The nanowire and other semiconductor components (e.g., source region 210 and drain region 230) can be the same or different semiconductor materials, such as one or more of silicon (Si), silicon germanium (SiGe), or a Group III-V semiconductor such as gallium arsenide (GaAs) or indium gallium arsenide (InGaAs) that is formed into vertical fins. At some point in the fabrication, some or all of the original fin structure may be replaced with a different fin structure using the original fin shape as a guide or template for forming the replacement fin or fins. For example, a sacrificial structure can be fabricated (e.g., with a tapered etch) to have the tapered shape of the vertical nanowire, with the sacrificial material removed at some point later and replaced with the nanowire semiconductor material filling the space occupied by the sacrificial structure.

Figure 3:
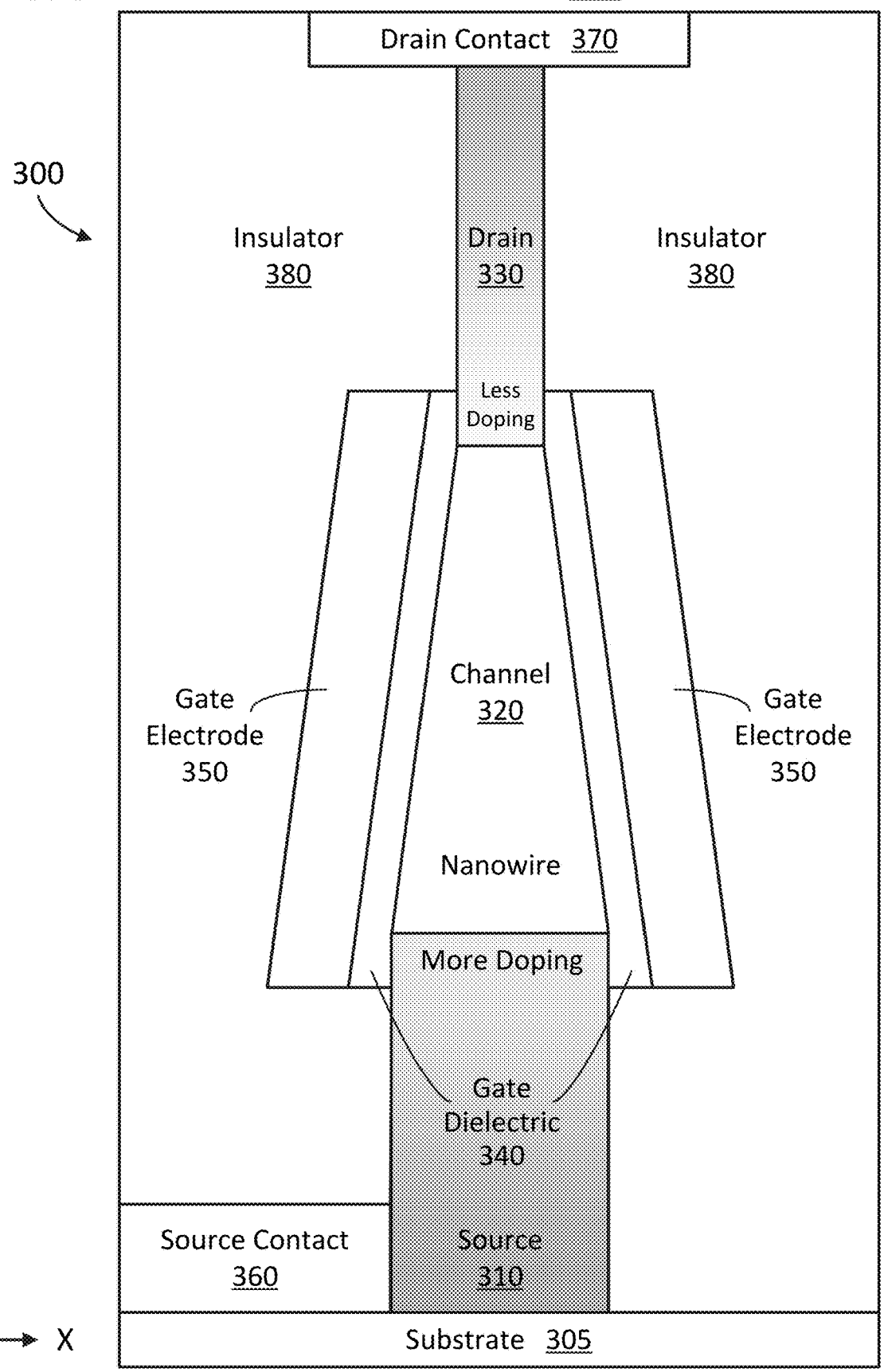

In the vertical FET 300 of FIG. 3, substrate 305, source region 310, a nanowire, channel region 320, drain region 330, gate dielectric 340, gate electrode 350, source contact 360, drain contact 370, and insulator 380 are similar to the same named structures of the FET 100 of FIG. 1. In the FET 300, however, the doping is different (e.g., asymmetric) between that of the source region 310 and that of the drain region 330. In further detail, the drain region 330 is doped less (such as one half, or one fifth, or one tenth as much) near the channel region 320 than the source region 310 is doped near the channel region 320. This asymmetry in doping can help further reduce BTBT for low bandgap channel region materials.

Figure 4:
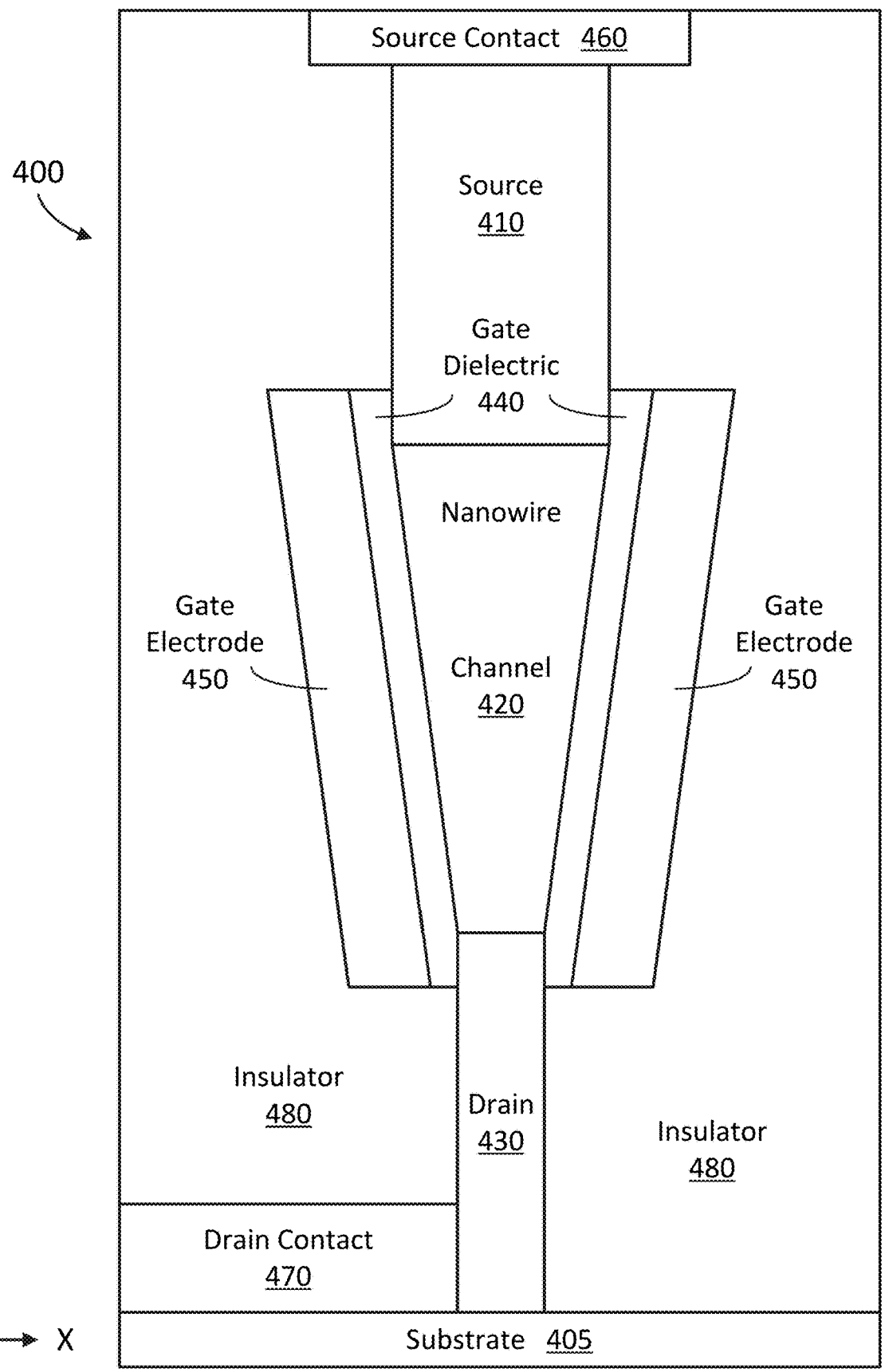

In the vertical FET 400 of FIG. 4, substrate 405, source region 410, a nanowire, channel region 420, drain region 430, gate dielectric 440, gate electrode 450, source contact 460, drain contact 470, and insulator 480 are similar to the same named structures of the FET 100 of FIG. 1. In the FET 400, however, the components (other than the substrate 405) are reversed in the vertical dimension. For example, the drain region 430 and the drain contact 470 are on the bottom, while the source contact 460 (and source region 410) are on the top. Otherwise, features and description of the FET 400 are similar to those of the FET 100. The FET 400 can be formed, for example, with a similar process to the FET 100. Here, the channel region 420 can be formed, for example, with a tapered etch into sacrificial material to create the reverse (or upside down) tapered shape, then filled with semiconductor material to form the channel region 420. In another embodiment, the etched tapered portion is first lined with gate electrode 450 material, then gate dielectric 440 material, then the channel region 420 material.

Figure 5:
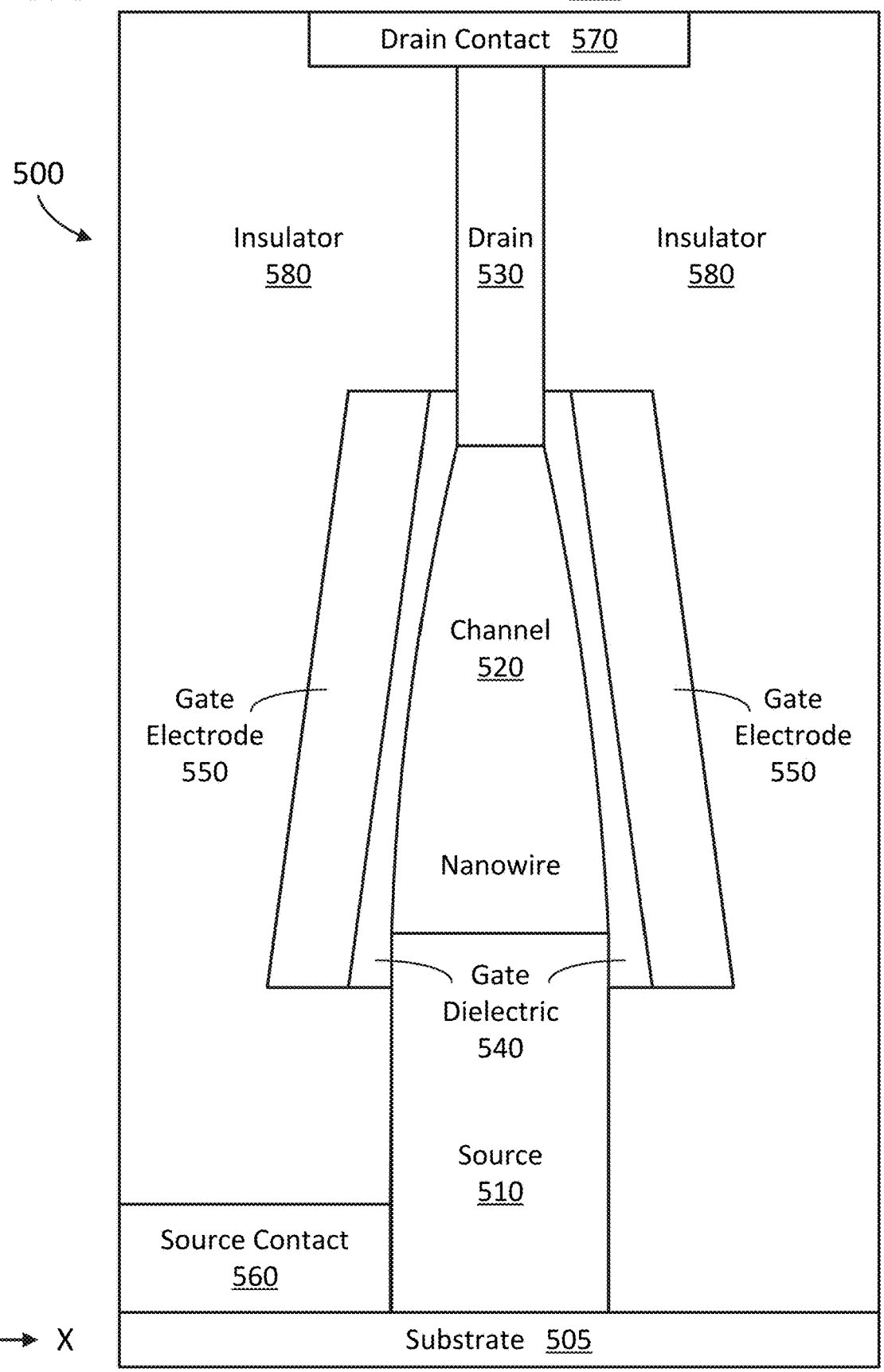

In the vertical FET 500 of FIG. 5, substrate 505, source region 510, a nanowire, channel region 520, drain region 530, gate dielectric 540, gate electrode 550, source contact 560, drain contact 570, and insulator 580 are similar to the same named structures of the FET 100 of FIG. 1. In the FET 500, however, the nanowire (and channel region 520) is convex tapered. In general, the illustrations in FIGS. 1A-7 may be idealized, and not necessarily reflective of ordinary process variation that can take place on features on the order of a few tens of nm or less, such as 10 or 20 nm. In the FET 500, the tapering of the channel region 520 is illustrated as convex, but the dimension restrictions at the drain and source ends of the channel region 520 are otherwise similar to or the same as example narrowest dimension limitations described with earlier embodiments.

Figure 6:
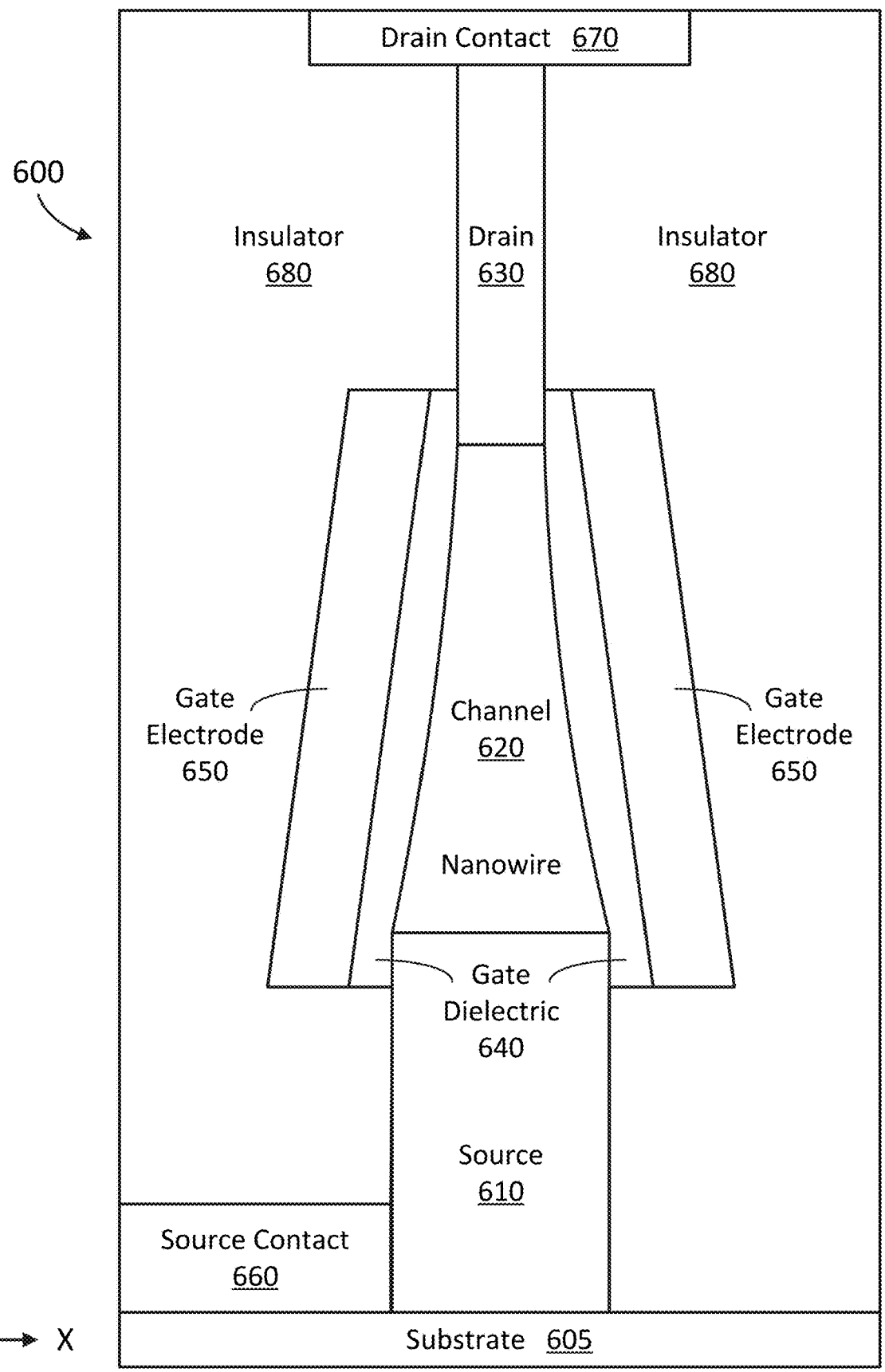

In the vertical FET 600 of FIG. 6, substrate 605, source region 610, a nanowire, channel region 620, drain region 630, gate dielectric 640, gate electrode 650, source contact 660, drain contact 670, and insulator 680 are similar to the same named structures of the FET 100 of FIG. 1. In the FET 600, however, the nanowire (and channel region 620) is concave tapered. This difference notwithstanding, the dimension restrictions at the drain and source ends of the channel region 620 are otherwise similar to or the same as example narrowest dimension limitations described above with earlier embodiments.

Figure 7:
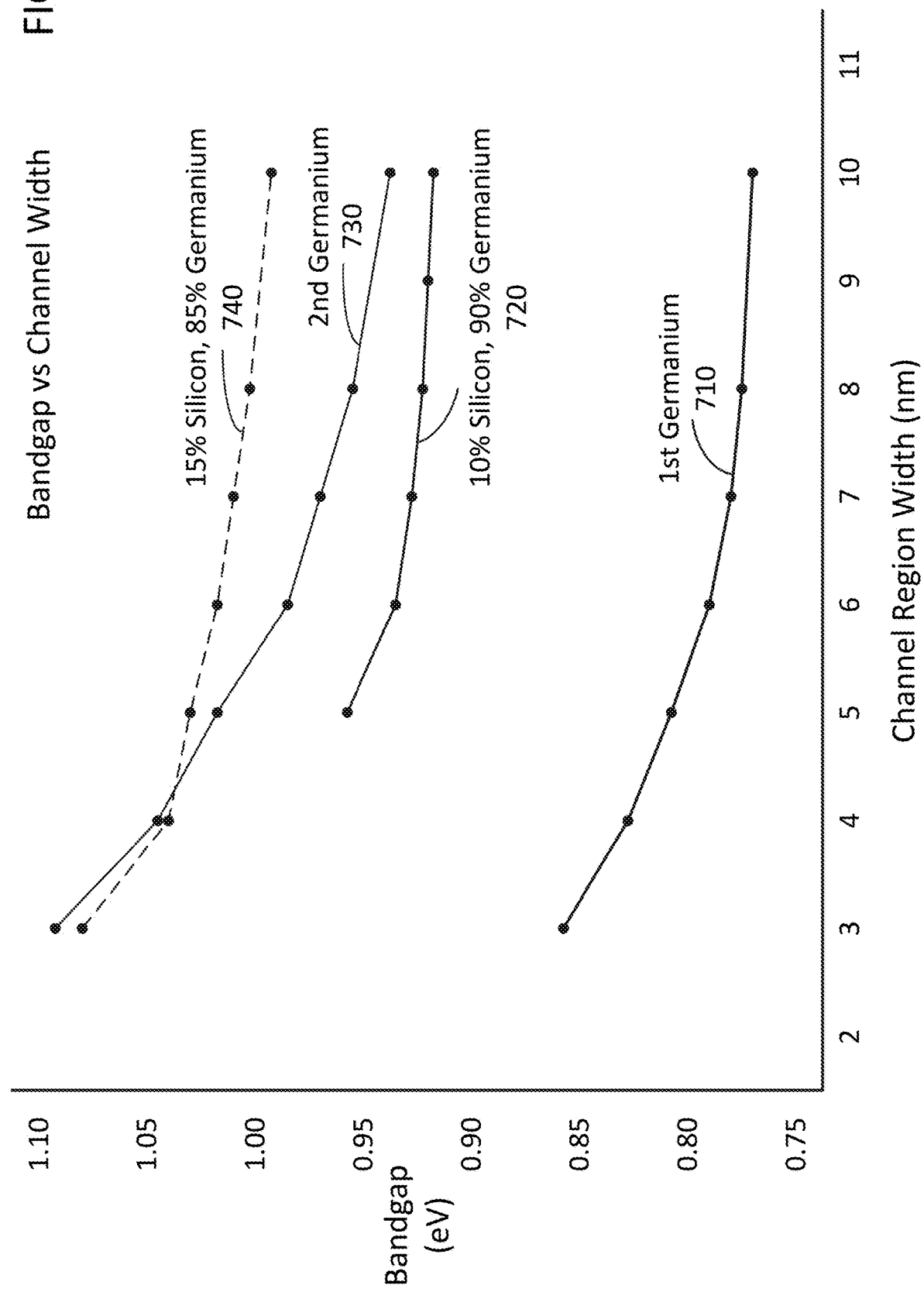
FIG. 7 is a graph illustrating the relationship of bandgap to channel region width for some example channel region widths and channel region materials of asymmetrical semiconductor nanowire FETs, according to some embodiments of the present disclosure.

FIG. 7 is a graph illustrating the relationship of bandgap to channel region width for some example channel region widths and channel region materials of asymmetrical semiconductor nanowire FETs, according to some embodiments of the present disclosure. In the graph of FIG. 7, four different curves 710, 720, 730, and 740 are illustrated. The x-axis represents the channel region width or narrowest dimension (in nm). The y-axis represents the bandwidth (in eV). The impact of channel region width on bandgap diminishes significantly for channel region widths above ten nm. On the other hand, device fabrication and reliability can become problematic for channel region widths below two or three nm. Accordingly, representative bandgaps are illustrated for four different low bandgap materials and for channel region widths between three and ten nm.

Referring to FIG. 7, curve 710 represents a semiconductor having a first germanium structure, one with a normal (unconstrained) bandgap of around 0.77 eV. Curve 730, on the other hand, represents a semiconductor having a second germanium structure, one with a normal (unconstrained) bandgap of around 0.94 eV. Curve 720 represents a semiconductor having a SiGe structure including 10% silicon and 90% germanium, with a normal (unconstrained) bandgap of around 0.92 eV. Curve 740 represents a semiconductor having a SiGe structure including 15% silicon and 85% germanium, with a normal (unconstrained) bandgap of around 1.00 eV. The example semiconductors illustrated in FIG. 7 show below about four or five nm, the channel region width of asymmetrical semiconductor nanowire FETs has a significant impact on the bandgap of the semiconductor. This increase in bandgap, when applied at the drain/channel region boundary (and not at the source/channel region boundary), can significantly reduce BTBT while still maintaining similar on-state saturated currents.

Methodology

Figure 8:
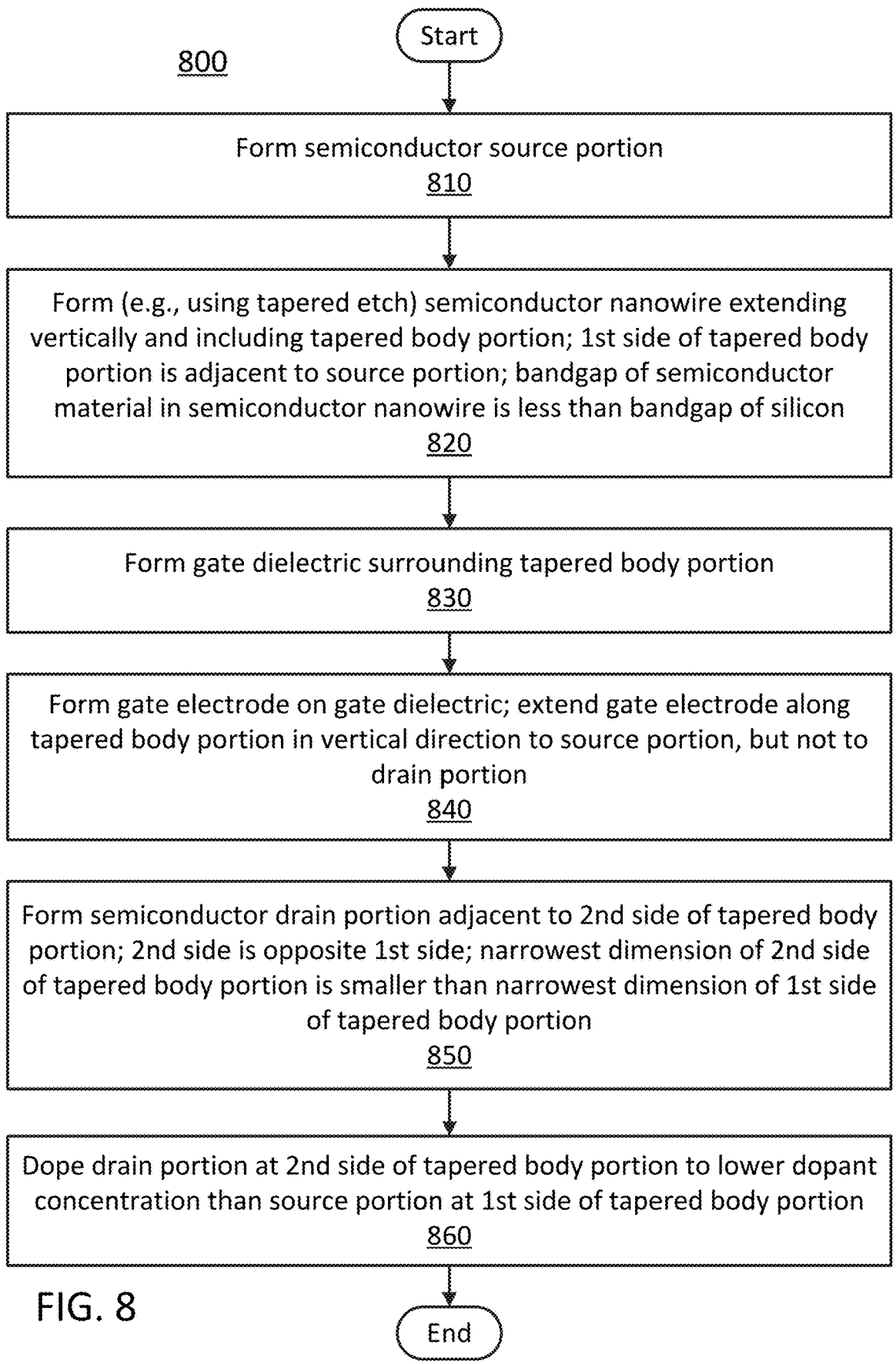
FIG. 8 is a flow diagram of an example method of fabricating an integrated circuit structure having one or more asymmetrical semiconductor nanowire FETs, according to an embodiment of the present disclosure.

FIG. 8 is a flow diagram of an example method 800 of fabricating an integrated circuit (IC) structure having one or more asymmetrical semiconductor nanowire FETs, according to an embodiment of the present disclosure. This and other methods disclosed herein may be carried out using integrated circuit fabrication techniques such as photolithography as would be apparent in light of the present disclosure. The corresponding transistors and other devices may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal, or electrically conductive), either directly or indirectly (such as through one or more conductive layers in between).

Referring to the method 800 of FIG. 8 (with specific example references to the FET structures of FIGS. 1-6), processing begins with forming 810 a semiconductor source portion (such as source 110), and forming 820 a semiconductor nanowire (such as the nanowire of FIG. 1, or channel region 120) extending vertically and including a tapered body portion. For instance, the forming 820 can be through using a tapered etch. A first side (such as the bottom side) of the tapered body portion is adjacent to the source portion, and the bandgap of the semiconductor material in the semiconductor nanowire is less than the bandgap of silicon (e.g., germanium, or a combination of germanium and silicon). The tapered etch can be formed by wet etch and/or dry etch, according to some embodiments.

In some such embodiments, a dry etch is used as it affords a higher degree of process control. For instance, a dry etch generally includes more knob control, such as knobs for adjusting chemistry parameters (e.g., such as gas flow such as carbon tetrafluoride ($CF_4$), methyl fluoride ($CH_3F$), or fluoroform ($CHF_3$)), as well as knobs for adjusting plasma parameters (e.g., such as chamber pressure, RF frequency, and DC bias). A dry etch scheme may be thought of as generally including etching and passivation. In particular, the etching includes physical etching and chemical etching, and passivation is used to inhibit the chemical etch from attacking passivated sidewalls and control profile. The passivation effectively applies a polymer or some other suitable passivation material to the sidewall of channel region so that the physical etch combined with the chemical etch can selectively act on the un-passivated portions of the channel region to provide the desired tapered profile as variously provided herein. In a more general sense, adjustment to the process knobs can be used to control polymerization (passivation) and make a tapered etch. Further note that in the context of the chemistry parameters, different gasses $CF_4$, $CH_3F$ and $CHF_3$ have different C/F ratios, leading to different amount of polymer/passivation. Some example embodiments utilizing a dry etch are carried out on a nanowire channel having a vertical height in the range of 5 nm to 100 nm, with W1 and W2 each in the range of 2-50 nm (W2 being larger than W1, as best shown in FIG. 1). The nanowire channel material can be, for instance, indium arsenide (InAs), indium gallium arsenide (InGaAs), indium phosphide (InP), germanium, silicon, SiGe, a group III-N semiconductor compound such as gallium nitride (GaN), and the poly version of any such materials, to name a few examples. The chamber pressure can be in the range of, for instance, 1 mTorr to 1 Torr depending on chamber type as will be appreciated. The bias voltage can vary, for instance, from 0 V to 100 V, and the etch may include any of the following gasses: $CH_4$, $CH_3F$, $CHF_3$, Hydrobromic acid (HBr), oxygen, argon, $CF_4$, chlorine, boron trichloride ($BCl_3$), fluorotrichloromethane ($CCl_3F$) with mixture of oxygen, argon, nitrogen, and helium, to name a few examples.

In other example embodiments, a tapered wet etch can be used to provide a tapered crystalline-based taper (along a given crystalline lattice plane). For example, tetramethyl-ammonium hydroxide (TMAH) or hot ammonia based etch chemistry can be used to make an inverted pyramid structure (having a tapered profile) on an Si 100 substrate. In some embodiments, the channel material can then be deposited into the tapered recess within the silicon to provide the tapered nanowire (the silicon can be etched away to liberate the nanowire). In other embodiment the nanowire is the remaining silicon having the tapered profile. In a more general sense, the crystalline orientation of the substrate material (or channel material, as the case may be) can be used in conjunction with a wet etchant to provide a faceted or otherwise tapered profile as variously provided herein. One example embodiment utilizing a wet etch is carried out on a nanowire channel having a vertical height in the range of 5-100 nm, with W1 and W2 each in the range of 2-50 nm (W2 being larger than W1, as best shown in FIG. 1). The nanowire channel material is, for instance, silicon, germanium, SiGe, silicon germanium carbon (SiGe:C), or other Group IV semiconductor material, to name a few examples. The etch may include, for instance, TMAH, hot ammonia, and citric/peroxide chemistry, at standard temperature and concentration levels, to name a few examples.

Numerous wet and/or dry tapered etch schemes can be utilized to provide tapered nanowire channels, as will be appreciated in light of this disclosure.

The method 800 further includes forming 830 a gate dielectric (such as gate dielectric 140) surrounding the tapered body portion, and forming 840 a gate electrode (such as gate electrode 150) on the gate dielectric. The method 800 further includes forming 850 a semiconductor drain portion (such as drain 130) adjacent to a second side (such as the top side) of the tapered body portion, the second side being opposite the first side. The narrowest dimension of the second side of the tapered body portion is smaller than (e.g., at most half) the narrowest dimension of the first side of the tapered body portion. The method 800 further includes doping 860 the drain portion at the second side of the tapered body portion to a lower dopant concentration than the source portion at the first side of the tapered body portion.

While the above example methods appear as a series of operations or stages, it is to be understood that there is no required order to the operations or stages unless specifically indicated.

Example System

Figure 9:
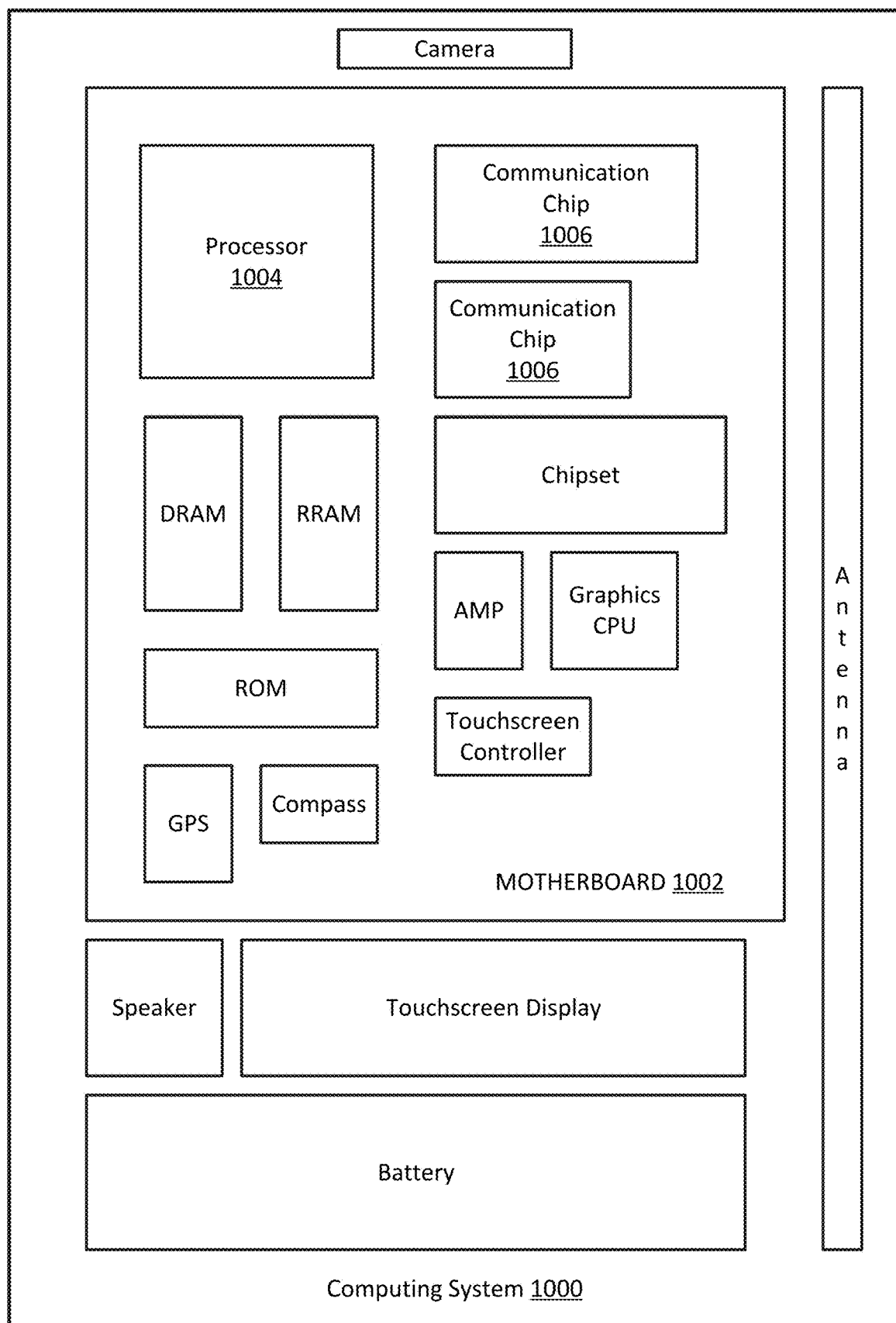
FIG. 9 illustrates an example computing system implemented with one or more integrated circuit structures or techniques disclosed herein, according to an embodiment of the present disclosure.

FIG. 9 illustrates an example computing system 1000 implemented with one or more integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including asymmetrical semiconductor nanowire FETs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more asymmetrical semiconductor nanowire FETs) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., asymmetrical semiconductor nanowire FETs) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., asymmetrical semiconductor nanowire FETs) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., asymmetrical semiconductor nanowire FETs) formed using the disclosed techniques, as variously described herein.

Further Example Embodiments

The following examples pertain to further embodiments, from which numerous permutations and configurations will be apparent.

Example 1 is an integrated circuit (IC) structure including: a semiconductor nanowire extending in a length direction and including a body portion; a gate dielectric surrounding the body portion; a gate electrode on the gate dielectric; a semiconductor source portion adjacent to a first side of the body portion; and a semiconductor drain portion adjacent to a second side of the body portion, the second side being opposite the first side, and the narrowest dimension of the second side of the body portion being at least one nanometer (nm) smaller than the narrowest dimension of the first side of the body portion.

Example 2 includes the IC structure of Example 1, wherein the narrowest dimension of the second side of the body portion is at most half the narrowest dimension of the first side.

Example 3 includes the IC structure of any of Examples 1-2, wherein the narrowest dimension of the second side of the body portion is at most four nm, and the narrowest dimension of the first side is at least six nm.

Example 4 includes the IC structure of any of Examples 1-3, wherein the narrowest dimension of the second side of the body portion is at most three nm, and the narrowest dimension of the first side is at least eight nm.

Example 5 includes the IC structure of any of Examples 1-4, wherein the narrowest dimension of the second side of the body portion is in the range of two to eight nm smaller than the narrowest dimension of the first side.

Example 6 includes the IC structure of any of Examples 1-5, wherein the gate electrode extends along the body portion in the length direction to the source portion, but not to the drain portion.

Example 7 includes the IC structure of any of Examples 1-6, wherein the drain portion at the second side of the body portion has a lower dopant concentration than the source portion at the first side of the body portion.

Example 8 includes the IC structure of any of Examples 1-7, wherein the length direction is a vertical direction relative to an underlying substrate.

Example 9 includes the IC structure of any of Examples 1-8, wherein the nanowire has a tapered cross-section in the length direction.

Example 10 includes the IC structure of Example 9, wherein the nanowire has a conical tapering.

Example 11 includes the IC structure of Example 9, wherein the nanowire has a convex tapering.

Example 12 includes the IC structure of Example 9, wherein the nanowire has a concave tapering.

Example 13 includes the IC structure of any of Examples 1-12, wherein the bandgap of the semiconductor material in the semiconductor nanowire is less than the bandgap of silicon.

Example 14 includes the IC structure of any of Examples 1-13, wherein the nanowire includes germanium.

Example 15 includes the IC structure of any of Examples 1-14, wherein one or more of the body portion, the source portion, and the drain portion include or includes dopant in the form of impurities.

Example 16 is a computing system including the IC structure of any of Examples 1-15.

Example 17 is an integrated circuit (IC) structure including: a semiconductor nanowire extending vertically and including a tapered body portion, the tapered body portion including germanium; a gate dielectric surrounding the tapered body portion; a gate electrode on the gate dielectric; a semiconductor source portion adjacent to a first side of the tapered body portion, the first side being a top or a bottom of the tapered body portion; and a semiconductor drain portion adjacent to a second side of the tapered body portion, the second side being the other of the top or the bottom of the tapered body portion, and the narrowest dimension of the second side of the tapered body portion being smaller than the narrowest dimension of the first side of the tapered body portion.

Example 18 includes the IC structure of Example 17, wherein the narrowest dimension of the second side of the tapered body portion is at most half the narrowest dimension of the first side.

Example 19 includes the IC structure of any of Examples 17-18, wherein the narrowest dimension of the second side of the tapered body portion is at most four nanometers (nm), and the narrowest dimension of the first side is at least six nm.

Example 20 includes the IC structure of Example 19, wherein the narrowest dimension of the second side of the tapered body portion is at least two nm, and the narrowest dimension of the first side is at most ten nm.

Example 21 includes the IC structure of Example 20, wherein the narrowest dimension of the second side of the tapered body portion is about three nm, and the narrowest dimension of the first side is about eight nm.

Example 22 includes the IC structure of any of Examples 17-21, wherein the narrowest dimension of the second side of the tapered body portion is in the range of two to eight nanometers (nm) smaller than the narrowest dimension of the first side.

Example 23 includes the IC structure of any of Examples 17-22, wherein the gate electrode extends along the tapered body portion in the vertical direction to the source portion, but not to the drain portion.

Example 24 includes the IC structure of any of Examples 17-23, wherein the drain portion at the second side of the tapered body portion has a lower dopant concentration than the source portion at the first side of the tapered body portion.

Example 25 includes the IC structure of any of Examples 17-24, wherein the nanowire has a conical tapering.

Example 26 includes the IC structure of any of Examples 17-25, wherein the nanowire has a convex tapering.

Example 27 includes the IC structure of any of Examples 17-25, wherein the nanowire has a concave tapering.

Example 28 includes the IC structure of any of Examples 17-27, wherein one or more of the tapered body portion, the source portion, and the drain portion include or includes dopant in the form of impurities.

Example 29 is a computing system including the IC structure of any of Examples 17-28.

Example 30 is a method of fabricating an integrated circuit (IC) structure, the method including: forming a semiconductor source portion; forming a semiconductor nanowire extending vertically and including a tapered body portion, a first side of the tapered body portion being adjacent to the source portion, and the bandgap of the semiconductor material in the semiconductor nanowire being less than the bandgap of silicon; forming a gate dielectric surrounding the tapered body portion; forming a gate electrode on the gate dielectric; and forming a semiconductor drain portion adjacent to a second side of the tapered body portion, the second side being opposite the first side, and the narrowest dimension of the second side of the tapered body portion being smaller than the narrowest dimension of the first side of the tapered body portion.

Example 31 includes the method of Example 30, wherein the forming of the semiconductor nanowire comprises using a tapered etch.

Example 32 includes the method of any of Examples 30-31, wherein the narrowest dimension of the second side of the tapered body portion is at most half the narrowest dimension of the first side.

Example 33 includes the method of any of Examples 30-32, wherein the narrowest dimension of the second side of the tapered body portion is at most four nanometers (nm), and the narrowest dimension of the first side is at least six nm.

Example 34 includes the method of any of Examples 30-33, wherein the narrowest dimension of the second side of the tapered body portion is in the range of two to eight nanometers (nm) smaller than the narrowest dimension of the first side.

Example 35 includes the method of any of Examples 30-34, wherein the forming of the gate electrode includes extending the gate electrode along the tapered body portion in the vertical direction to the source portion, but not to the drain portion.

Example 36 includes the method of any of Examples 30-35, further including doping the drain portion at the second side of the tapered body portion to a lower dopant concentration than the source portion at the first side of the tapered body portion.

Example 37 includes the method of any of Examples 30-36, wherein the nanowire has a conical tapering.

Example 38 includes the method of any of Examples 30-37, wherein the nanowire has a convex tapering.

Example 39 includes the method of any of Examples 30-37, wherein the nanowire has a concave tapering.

Example 40 includes the method of any of Examples 30-39, wherein the nanowire includes germanium.

Example 41 includes the method of any of Examples 30-40, wherein one or more of the tapered body portion, the source portion, and the drain portion include or includes dopant in the form of impurities.

Example 42 is a method of fabricating a computing system including fabricating the IC structure using the method of any of Examples 30-41.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
   a semiconductor nanowire extending in a length direction and including a body portion;
   a gate dielectric surrounding the body portion;
   a gate electrode on the gate dielectric;
   a semiconductor source portion adjacent to a first side of the body portion; and
   a semiconductor drain portion adjacent to a second side of the body portion, the second side being opposite the first side, and the narrowest dimension of the second side of the body portion being at least one nanometer (nm) smaller than the narrowest dimension of the first side of the body portion, wherein one of the semiconductor drain portion or the semiconductor source portion is vertically over the other of the semiconductor drain portion or the semiconductor source portion, wherein the body portion is tapered from the semiconductor source portion to the semiconductor drain portion, and wherein the gate electrode extends along the body portion in the length direction to the source portion, but not to the drain portion.

2. The IC structure of claim 1, wherein the narrowest dimension of the second side of the body portion is at most half the narrowest dimension of the first side.

3. The IC structure of claim 1, wherein the narrowest dimension of the second side of the body portion is at most four nm, and the narrowest dimension of the first side is at least six nm.

4. The IC structure of claim 1, wherein the narrowest dimension of the second side of the body portion is at most three nm, and the narrowest dimension of the first side is at least eight nm.

5. The IC structure of claim 1, wherein the narrowest dimension of the second side of the body portion is in the range of two to eight nm smaller than the narrowest dimension of the first side.

6. The IC structure of claim 1, wherein the drain portion at the second side of the body portion has a lower dopant concentration than the source portion at the first side of the body portion.

7. The IC structure of claim 1, wherein the length direction is a vertical direction relative to an underlying substrate.

8. The IC structure of claim 1, wherein the nanowire has a tapered cross-section in the length direction.

9. The IC structure of claim 8, wherein the nanowire has a conical tapering.

10. The IC structure of claim 8, wherein the nanowire has a convex tapering.

11. The IC structure of claim 8, wherein the nanowire has a concave tapering.

12. The IC structure of claim 1, wherein the bandgap of semiconductor material in the semiconductor nanowire is less than the bandgap of silicon.

13. The IC structure of claim 1, wherein the nanowire comprises germanium.

14. The IC structure of claim 1, wherein one or more of the body portion, the source portion, and the drain portion include or includes dopant in the form of impurities.

15. A computing system comprising the IC structure of claim 1.

16. An integrated circuit (IC) structure comprising:
a semiconductor nanowire extending vertically and including a tapered body portion, the tapered body portion including germanium;
a gate dielectric surrounding the tapered body portion;
a gate electrode on the gate dielectric;
a semiconductor source portion adjacent to a first side of the tapered body portion, the first side being a top or a bottom of the tapered body portion; and
a semiconductor drain portion adjacent to a second side of the tapered body portion, the second side being the other of the top or the bottom of the tapered body portion, and the narrowest dimension of the second side of the tapered body portion being smaller than the narrowest dimension of the first side of the tapered body portion, wherein one of the semiconductor drain portion or the semiconductor source portion is vertically over the other of the semiconductor drain portion or the semiconductor source portion, wherein the tapered body portion is tapered from the semiconductor source portion to the semiconductor drain portion, and wherein the gate electrode extends along the tapered body portion in the vertical direction to the source portion, but not to the drain portion.

17. An integrated circuit (IC) structure comprising:
a semiconductor nanowire extending in a length direction and including a body portion;
a gate dielectric surrounding the body portion;
a gate electrode on the gate dielectric;
a semiconductor source portion adjacent to a first side of the body portion; and
a semiconductor drain portion adjacent to a second side of the body portion, the second side being opposite the first side, and the narrowest dimension of the second side of the body portion being at least one nanometer (nm) smaller than the narrowest dimension of the first side of the body portion, wherein one of the semiconductor drain portion or the semiconductor source portion is vertically over the other of the semiconductor drain portion or the semiconductor source portion, wherein the gate electrode extends along the body portion in the length direction to the source portion, but not to the drain portion.

* * * * *